United States Patent [19]

Leslie

[11] Patent Number: 4,987,416

[45] Date of Patent: Jan. 22, 1991

[54] ANALOG TO DIGITAL CONVERTERS

[75] Inventor: Thomas C. Leslie, Kislingbury, England

[73] Assignee: Plessey Overseas Limited, Ilford, England

[21] Appl. No.: 390,545

[22] Filed: Aug. 8, 1989

[30] Foreign Application Priority Data

Sep. 6, 1988 [GB] United Kingdom ................. 8820878

[51] Int. Cl.$^5$ ............................................. H03M 1/06
[52] U.S. Cl. ...................................... 341/118; 341/200
[58] Field of Search ............... 341/200, 155, 163, 161, 341/118; 358/135, 136

[56] References Cited

U.S. PATENT DOCUMENTS

| 4,684,925 | 8/1987 | Maruta | 341/166 |
| 4,812,815 | 3/1989 | Miyakoshi et al. | 341/144 X |
| 4,899,155 | 2/1990 | Jackson | 341/200 |

Primary Examiner—William M. Shoop, Jr.
Assistant Examiner—Sharon D. Logan
Attorney, Agent, or Firm—Fleit, Jacobson, Cohn, Price, Holman & Stern

[57] ABSTRACT

In order to reduce noise in single or multiloop analog to digital converter circuits employing n-bit quantisers (n>1), only the MSB of the quantiser output is fed back in a feedback loop in reduce problems of overload in a feed-forward (integrator filter). The feedback MSB may be subtracted as an offset from the input analog signal or used to control the sign of inversion of a signal inverter.

12 Claims, 11 Drawing Sheets $$y(z) = a(z) + T(z)\left[\frac{2}{z} - \frac{1}{z^2}\right]$$

$$= s(z) + \frac{(z-1)^2}{z^2} q(z)$$

$$y(z) = s(z) + sgn\left[\frac{c(z)}{z}\right]\frac{z-1}{z}q(z)$$

$$y(z) = \left(\frac{z-1}{z}\right)^2 sgn\frac{(c_2(z))}{z} sgn\frac{(c_1(z))}{z} c_2(z)$$

$$= s(z) + \frac{(z-1)^2}{z^2} sgn\left[\frac{c_2(z)}{z}\right] sgn\left[\frac{c_1(z)}{z}\right] q_2(z)$$

ANALOG TO DIGITAL CONVERTERS

This invention relates to analog to digital converters (ADCs).

ADCs represent a crucial element in the design of many electrical circuits. The requirements for converter dynamic range are constantly increasing. For example, in the field of digital radio, current ADCs may have a signal-to-noise ratio (SNR) as high as 100 dB; practical forms of digital radio require a much higher SNR.

A variety of techniques are known for increasing the available SNR from a given ADC, for example by sampling the incoming analog signal at a rate greater than twice the Nyquist frequency, and filtering the out-of-baseband quantisation noise. In addition the ADC quantising element may be placed in multi-loop feedback circuits which are designed to remove the noise arising from the quantisation process out of the baseband. Reference is made to the following papers for the theory of such techniques:

(1) Claasen, T. A. C. M., Mecklenbrauger, W. F. G., Peek, J. B. H., and van Hurck, N., "Signal processing method for improving the dynamic range of A/D and D/A converters", IEEE Trans Acoust, Speech and Sig Proc, vol ASSP-28, No. 5, October 1980; and, (2) Tewksbury, S. K., and Hallock, R. W., "Oversampled, linear predictive, and noise-shaping coders of order N>1", IEEE, Trans Circ and Sys, vol CAS-25, No. 7, pp 436-447, July 1978.

The particular type of circuit of interest in the present invention is known as a "noise-shaping coder" (which is to be contrasted with other types, for example linear predictive coders).

One method of visualising the operation of a noise-shaping coder is as a device which imparts a low frequency pre-emphasis to its analog input, balanced by a low frequency de-emphasis applied to the signal's quantised representation. Since the quantising noise is subjected to only the latter process, the noise experiences a net low frequency de-emphasis, resulting in an enhanced low frequency signal-to-noise ratio. A graphical representation of this procedure is shown in FIGS. 1(a-f), which are thought to be self-explanatory.

The requirement to match an analog domain filter (the pre-emphasis) to a digital domain one (the de-emphasis), restricts the choice of these components to rather simple designs. For this reason, an integrator and a differentiator are normally selected as the pre-emphasis and de-emphasis filters, respectively. A problem with this selection is the tendency of the integrator to overload. Some means of overcoming this undesirable phenomenon must be sought.

One possibility which was proposed by Claasen et al, as shown in FIG. 2, is to employ an integrator 2 which incorporates a level sensor at its output to detect the onset of overload, and invert the gain of the integrator when this happens. At the same time, the gain inversion information is coded as a simple binary stream which bypasses the quantising element 3 in a loop 4, and controls an amplifier 6 within a filter 8 which provides gain correction on the quantised data. The output of this network is then de-emphasised by differentiator 10 to complete the A-D conversion. The problem with such a circuit is that the gain inversion signal is asynchronous with the quantisation process. This can give rise to timing problems, particularly if it is desired to use two or more integration steps.

Another known method of controlling integrator overload is to sense the sign of its output and add a fixed offset of the opposite sign as its input. However the 'sign-sensing' of the integrator output is exactly the function performed by a single-bit quantising element, and the optimum feedback voltage is half the integrator range, which is equal to the bit size. Thus the most efficient solution is to feedback the quantiser output round both elements (quantiser and integrator) rather than use a loop round the integrator alone. The result of this choice is the well-known, first-order, noise-shaping ADC as shown in FIG. 3.

Referring to FIG. 3, the input signal S is fed via a differencing circuit 20 to an integrator 22 which is indicated in conventional z-transform form as $z/(z-1)$. A one-bit quantiser 24 digitises the input signal, introducing noise $q(z)$. The output signal y is fed back via a delay circuit 26, indicated as $z^{-1}$, to the differencing circuit 20 where it is subtracted from the input.

The in-band quantisation noise within such circuits can be reduced by using extra feedback loops. The effect of this is indicated in chain dotted lines in FIGS. 1 a-f as increasing the sharpness of the pre-emphasis/de-emphasis process so that the quantisation noise is reduced accordingly. A problem however with extra feedback loops is that the circuit goes close to an unstable condition where it tends to oscillate.

The SNR can also be improved by employing an n-bit quantiser unit to provide an n-bit digital code, where n>1. Such an arrangement is shown in FIG. 4, where similar parts to those of FIG. 3 are indicated by the same reference numeral. A quantiser 24' provides an n-bit output, which is applied via delay circuit 26 to a digital to analog converter 30 to provide an analog signal which is subtracted from the input signals. The output y may be expressed as:

$$y = s + \frac{z-1}{z} q + e \tag{1}$$

Thus the ADC quantisation noise is reduced by a factor $(z-1)/z$, but a further error is introduced as a result of the DAC conversion, which is unaffected by loop operation and sets an upper limit on the SNR which can be achieved.

Thus methods of improving the performance of noise-shaping ADC generally mean increasing the oversampling ratio, the order of the coder, or the word length of the quantising element. The attainable dynamic range of such ADC can be expressed to a very good approximation by the equation $$SNR = 6*n + 3*m*(1 + 2*p) \tag{2}$$

SNR = the dynamic range of the overall converter in dB.

n = the word length of the quantising element within the converter.

m = the amount of oversampling used in the converter expressed as the number of octaves above the basic Nyquist requirement.

p = the order, or number of feedback loops within the converter.

Eq. (2) indicates that increasing the order of the coder, the oversampling ratio, or the word length of the quantiser can all increase the dynamic range of the converter. Increases in the coder order tend to introduce stability problems. Increasing the oversampling ratio eventually reaches the point where the process technology can no longer cope with required loop operating speed. Increasing the resolution of the quantiser is considered undesirable for a couple of reasons. Firstly, multi-bit quantisers are precision components in which several comparators require accurately matched performance, whereas a single-bit quantiser contains only one comparator and thus no matching condition exists. Secondly the use of a multi-bit quantiser implies multi-bit feedback, and hence a multi-bit DAC at the end of the feedback loop which both adds to the complexity and limits the SNR of the overall converter.

It has now been realised that it is possible to increase the SNR of the noise-shaping ADC by employing a multi-bit quantiser but that cost and complexity may be reduced and DAC errors eliminated by feeding back a one bit representation of the signal, i.e. the most significant bit (herein referred to as MSB). This will maintain accuracy since the main purpose of the feedback signal is to reduce integrator overload at low frequency.

Thus the present invention provides in one aspect an analog-to-digital converter circuit comprising a differencing means for comparing an analog input signal and a feedback signal to provide an output dependent on the difference between the signals, a feed-forward filter coupled to receive the differencing means output for providing low-frequency preemphasis, and coupled to the input of an n-bit quantiser (where $n > 1$) for providing an output signal comprising an n-bit representation of the signal applied to its input, a means for truncating the quantiser output signal to the MSB and for providing a feedback signal whose value is dependent on the MSB, a feedback filter means coupled to receive the feedback signal and provide it to the differencing means, and correction means for providing a correction signal for combining with the quantiser output signal, to provide a converter circuit output signal which compensates for the effect of the truncation in the feedback loop.

Thus in accordance with the invention the analog digital converter maintains the accuracy of a multi-bit quantiser but avoids the use of a digital to analog converter in the feedback loop. A signal dependent on the MSB of the quantiser signal is fedback to the differencing means in order to provide an offset so that when the most significant bit goes high which is indicative of a situation in which the feed-forward filter may overload, the voltage offset which is introduced gives the resultant input signal a negative value whereby to reduce the magnitude of the signal in the feed-forward filter (integrator) thereby to reduce the risk of integrator overload. Hence accuracy of conversion and reduction of noise is maintained.

The feed-forward filter is preferably associated with an integration function of the incoming signal whereas the feedback filter is associated with a differentiation function. However where a multi-loop feedback structure is provided the association of the filters with the respective functions becomes looser and looser, as is well known in the art. In order to increase the effect of pre-emphasis/de-emphasis, the feedback loop structure may be of the Ritchie form having an nth order, where $n > 1$. Alternatively, nth order filters may be provided by connecting quantiser units with associated feedback loops in accordance with the invention in cascade, with the output of the feed-forward filter of the 1st loop providing the input of the 2nd feedback loop and the outputs of the quantiser units being combined to provide the converter circuit output.

In a further aspect, the present invention provides an analog-to-digital converter circuit comprising means for selectively inverting an input signal and feeding the signal via a feedforward filter providing low frequency pre-emphasis to an n-bit quantiser (where $n > 1$) for providing an output signal comprising an n-bit representation of the signal applied to its input, a means for truncating the quantiser output signal to the MSB and providing a feedback signal whose value is dependent on the MSB, a feedback filter means coupled to receive the feedback signal and to provide it to the selective inversion means for control thereof, and correction means for correcting the quantiser output signal to provide a converter circuit output signal which compensates for the effect of the selective inversion of the input signal.

In accordance with this further aspect of the invention, integrator overload is avoided by controlling the selective inversion means to invert the signal when the most significant bit of the quantiser output goes positive.

This aspect of the invention is particularly applicable to cascade structures where individual quantiser units with associated single feedback paths are connected in cascade. This further aspect of invention is difficult to apply to feedback loop structures of the Ritchie form. However, with units connected in cascade it is a relatively simple matter to arrange for appropriate signal inversion means to be connected at the signal output of the circuit in order to ensure that the output signal remains at the correct sign no matter how signal inverter means is operating.

In a particularly preferred embodiment of the invention with a cascade structure comprising quantiser units with associated feedback loops connected in cascade, it has been found that only the last quantiser unit in the cascade structure need be an n-bit quantiser, the remaining quantisers being single bit quantisers. This is because it can be shown that the last quantiser unit of the cascade structure provides the major contribution to accuracy of output and the other quantiser units maybe of simpler structure since they contribute less to the output signal; thus with this arrangement the cost of the multi-loop cascade structure is substantially reduced.

A preferred embodiment of the invention will now be described with reference to the accompanying drawings, wherein.

Referring now to FIGS. 5 to 13, a common feature of the circuits shown is that they all produce an n-bit output word, rather than a single bit data stream. This significantly increases the complexity of subsequent filter circuitry. However the maximum anticipated clock rate is about 10 MHZ, limited by switched-capacitor integrators, and the maximum output word length is around seven. It is possible to cope with these demands with known filtering techniques, which are introduced (but not shown).

Figure 4:
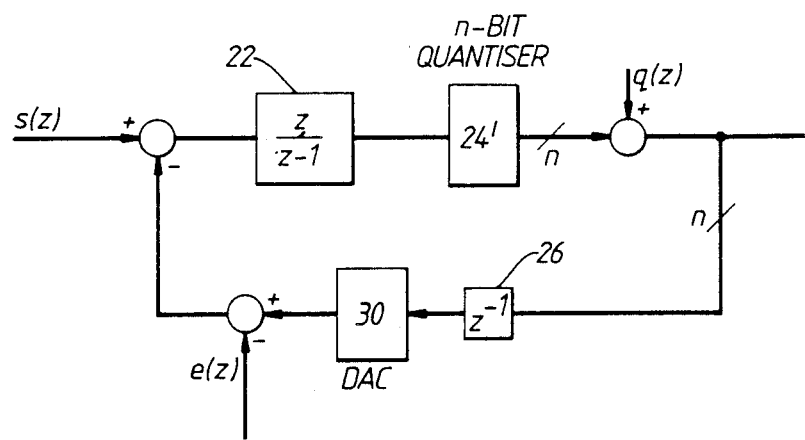
FIG. 4 is a circuit diagram of a known first order feedback loop, multi-bit, noise shaping ADC.
Figure 5:
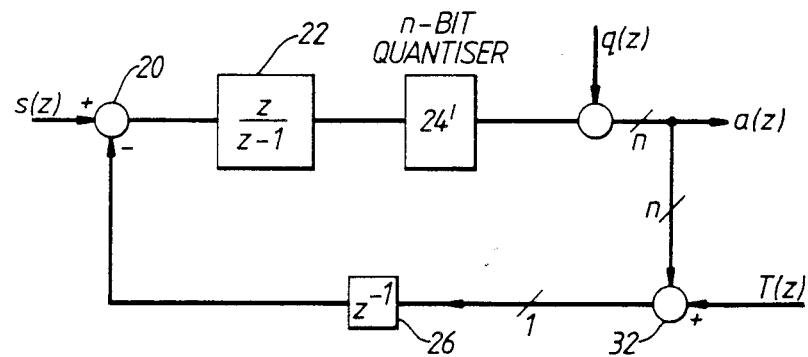
FIG. 5 is a circuit diagram of a first order, multi-bit quantiser, noise-shaping ADC included for explanation of the invention.

Referring to FIG. 5, there is shown a circuit for explanation of the invention, wherein similar parts to those of FIGS. 4 are referred to by similar reference numerals. A truncation error signal T is introduced in the feedback loop at 32 to account for the truncation of the quantiser output signal to the MSB. The truncation error signal is a known quantity; it is the quantiser output with the MSB removed. The quantiser 24' is an n-bit quantiser, where $n>1$ and $n<7$, in accordance with current technical limits.

Loop analysis of FIG. 5 yields the transfer relation $$a(z)=s(z)+(z-1)*q(z)/z-T(z)/z \quad (3)$$

Figure 6:
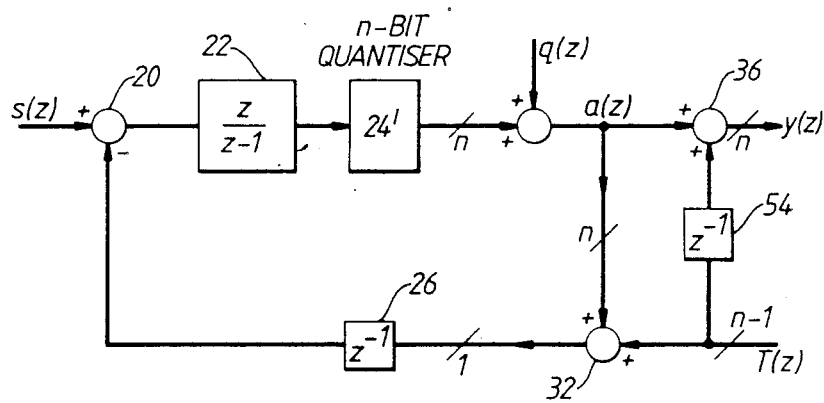
FIG. 6 is a circuit diagram of a first-order, multi-bit quantiser, noise-shaping ADC according to a first embodiment of the invention.

The truncation error term in the output signal can be cancelled by adding a delayed version of itself at the output, shown in FIG. 6, in which truncation signal T is delayed in unit 34 and added to the output in an adder 36. Thus:

$$y(z)=a(z)+T(z)/z=s(z)+(z-1)*q(z)/z \quad (4)$$

This expression is identical to that which would be obtained for a conventional single-bit coder of first order, with the important exception that, the noise term is that appropriate to a multi-bit quantiser. Relative to the single-bit system, such multi-bit quantiser with single-bit feedback, will reduce the unshaped noise by approximately $6*(n-1)$, where n is the quantiser resolution. This reduction takes place in addition to the benefits which accrue from both noise-shaping and oversampling. Thus the circuit of FIG. 6 forms a first embodiment of the invention.

Although a first order system has been described above, the feeding back of a single bit, and correcting for this truncation error at the output, can be applied to coders of all orders and styles. FIGS. 7-10 show the embodiments of the invention incorporating a second order Ritchie coder, third order Ritchie coder, second order cascade coder, and third order cascade coder respectively. In all cases the transfer functions given in the diagrams are identical to those which would have been obtained using single-bit quantisers, except that the actual magnitude of the quantisation noise power in the expressions is reduced by the factor $6*(n-1)$. It may be necessary to introduce gain amplifiers into the circuits to preserve correct signal levels.

An important feature of the present invention is that conditions within each of the feedback loops, in whatever coder structure is selected, are completely unaffected by the multi-bit quantisation and remain the same as with single bit quantisation configurations. There are no additional problems with integrators going out of range or quantiser overload.

With present known single-bit systems, using 1 $\mu$m CMOS technology, integrator operation restricts the maximum feasible loop rate to around 7.5 MHz. With a baseband assumed to be 30 kHz, the maximum SNR achievable from third order single-bit systems is approximately 105 dB for a Ritchie structure and 115 dB for a cascade form. (The discrepancy arises from the differing effects of the various gain blocks which have to be included in the system to prevent out-of-range conditions occurring at one or more of the sub-circuits involved.) With the present invention employing, in 1 $\mu$m CMOS, a 7-bit quantiser operating at 7.5 MHz, an improvement of about 36 dB in SNR can be achieved.

Referring again to FIG. 7, parts similar to that of FIG. 6 are indicated by the same reference numeral. The circuit is in second order Ritchie-Coder form with the addition of an extra feedback loop 40 extending from delay 26 to a subtractor unit 42 and including an integrator 44. Thus the fedback signal is subtracted from the input signal in subtractor 42 in the second loop 40 and is then fed via integrator 44 to further subtractor 20 where the signal in the first feedback loop is subtracted. In order to compensate for the truncation error signal in the feedback loops, the correction error from delay unit 34 is fed to adder unit 36 via an amplifier 46 having a gain of $\times 2$ and in addition via a delay unit 48 to a subtracting input of unit 36.

Figure 7:
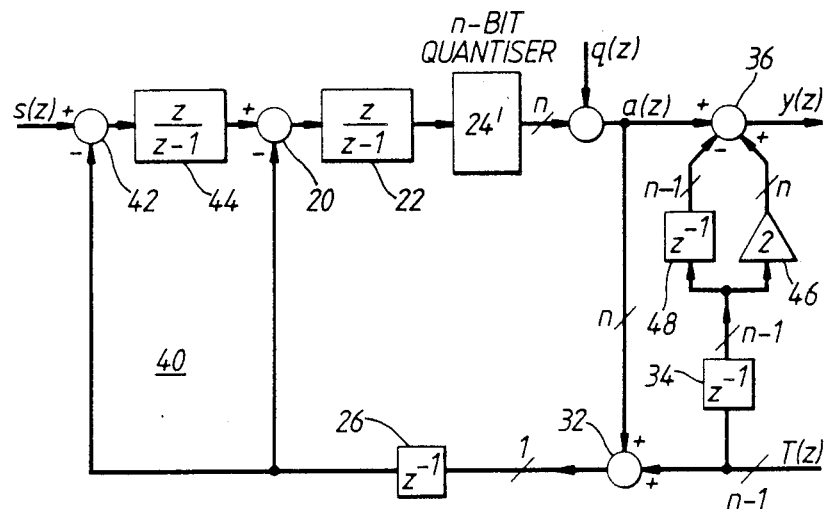
FIG. 7 is a circuit diagram of a second-order, multi-bit quantiser, noise-shaping ADC according to a second embodiment of the invention.
Figure 8:
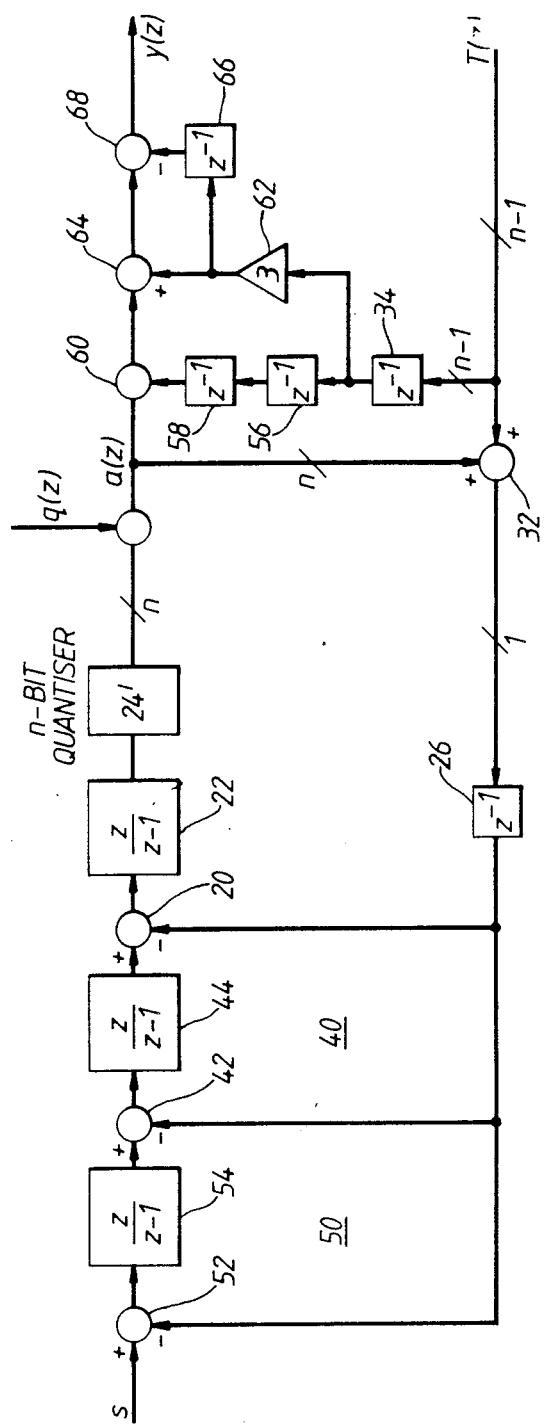
FIG. 8 is a circuit diagram of a third-order, multi-bit quantiser, noise-shaping ADC according to a third embodiment of the invention.

FIG. 8 discloses an embodiment of the invention incorporating a third-order Ritchie-Coder and parts similar to those of FIG. 7 are indicated by the same reference numerals. A third feedback loop 50 is included connected between delay unit 26 and a subtractor 52 which subtracts a feedback signal from the input signal s, the modified input signal being fed to an integrator 54 thence to a subtractor unit 42. In order to compensate for the truncation error signals arising from these feedback loops, the compensation circuit includes two delay units 56, 58 connected to a subtractor unit 60 which subtracts the delayed signal from the output signal a, an amplifier 62 having a gain of ($\times 3$) and providing an output which is added to the output signal from subtractor 60 in an addition unit 64. The output of amplifier 62 is also delayed in a unit 66 and the delayed signal is subtracted in a subtractor unit 68 from the output from adder 64 to provide the resultant output signal y.

Figure 9:
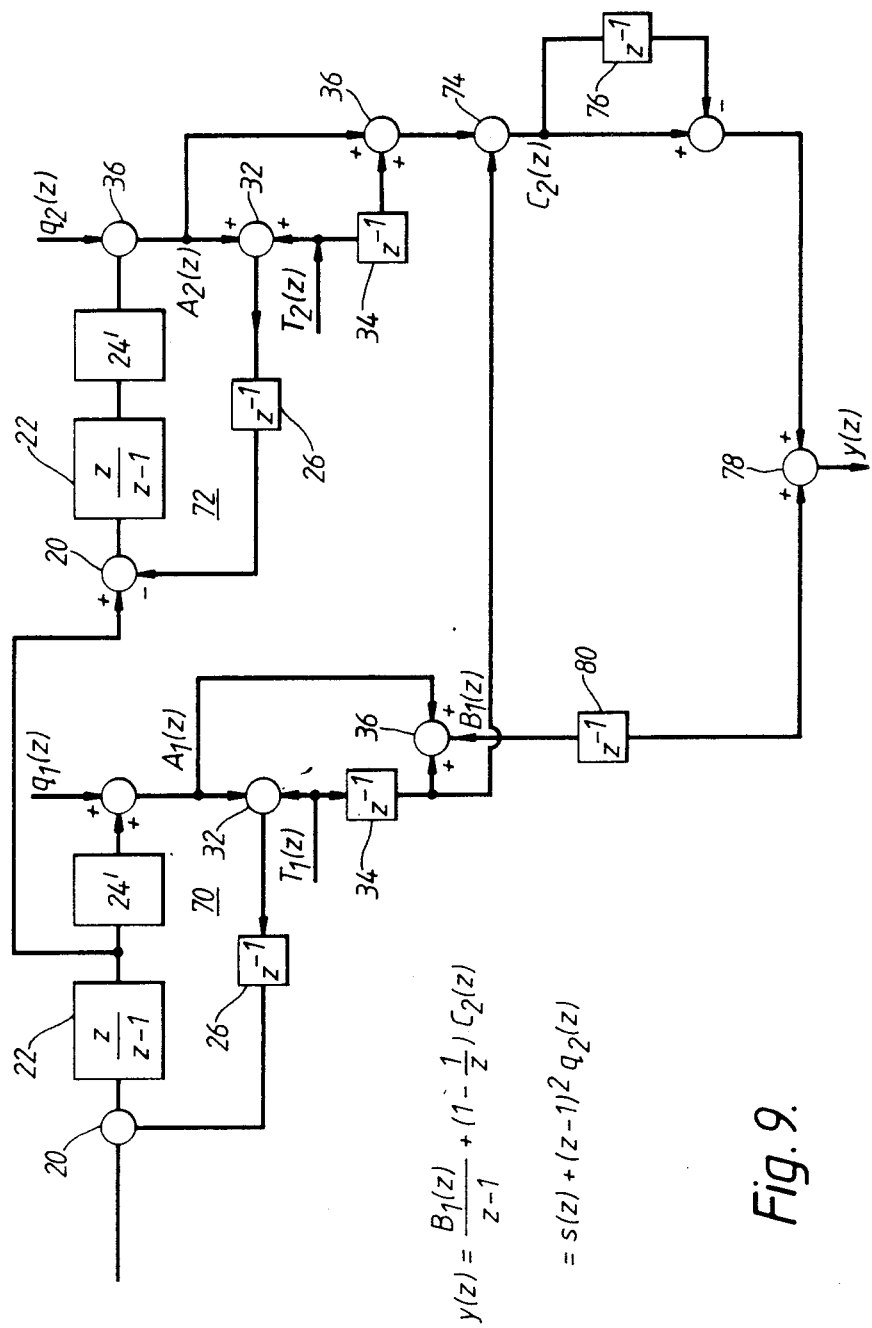
FIG. 9 is a circuit diagram of a second-order multi-bit quantiser cascade-connected, noise-shaping ADC according to a fourth embodiment of the invention.

Referring now to FIG. 9 there is shown an embodiment of the invention having a second order ADC connected in cascade form. Similar parts to those of FIG. 6 are indicated by the same reference numeral. It will be noted there are first and second quantiser circuits 70, 72, each circuit having a first order feedback circuit identical to the FIG. 6. However the output from integrator 22 of circuit 70 is supplied as an input to the subtractor unit 20 of circuit 72. The delayed version of the truncation error signal from unit 34 in circuit 70 is added to the output of circuit 72 in an adder unit 74 and the output of unit 74 is differentiated in a differentiator circuit 76 and added in an adder unit 78 with a delayed version of the output of circuit 70, as at 80. A resultant output signal y is provided from adder 78.

Figure 10:
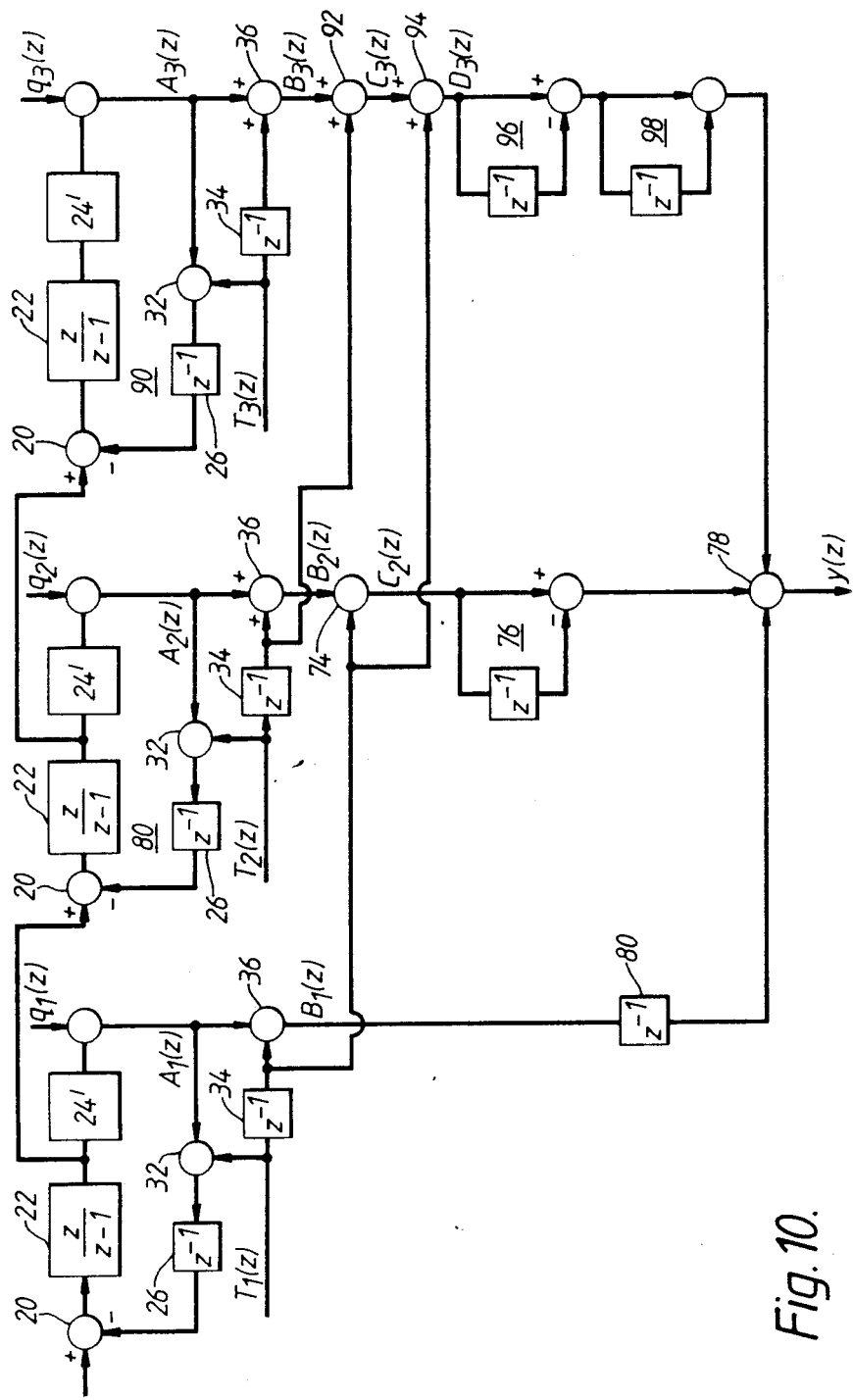
FIG. 10 is a circuit diagram of a third-order multi-bit quantiser cascade-connected, noise-shaping ADC according to a fifth embodiment of the invention.

Referring to FIG. 10, a third order feedback ADC arrangement in cascade form forming a further embodiment of the invention is shown. Similar parts to those of FIG. 9 will be indicated by similar reference numerals. The circuit incorporates a further single loop feedback circuit identical to that of FIG. 6 as at 90, circuit 90 receiving an input from integrator 22 of circuit 80. The ouput of circuit 90 is combined in an adder circuit 92 with the delayed version of the truncation error signal $T_2$ from circuit 80. The output of adder circuit 92 is combined in an adder circuit 94 with the delayed version of the truncation error signal $T_1$ of circuit 70. The output of circuit 94 is differentiated in a first differentiator circuit 96 and in a second differentiator circuit 98 and is added to the other signals from 80 and 76 input to adder circuit 78 to provide an outpu signal y.

Although DAC accuracy noise is often ignored in system with single-bit feedback, this strictly incorrect. Even a two level DAC has level inaccuracies. However these can be characterised by a gain and offset error in the DAC and 'lumped in' with gain and offset errors of other blocks which are needed in the feedback loop of a practical system (for example, another gain block). There is considerable force in the argument that the two-level DAC ought to be supplied by external reference sources, or at least that external components should be used to 'trim' an on-chip reference source.

Figure 1:
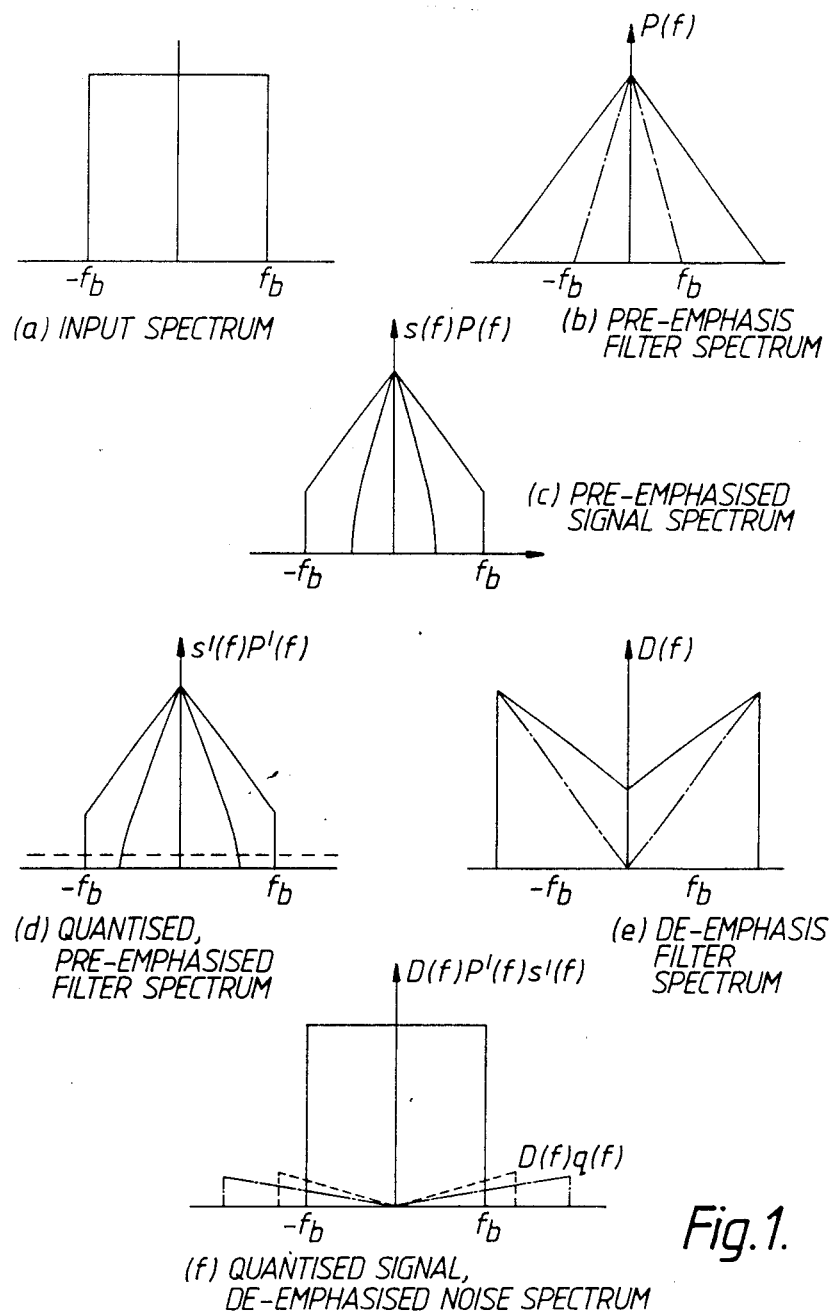
FIG. 1(a–f) is a series of schematic diagrams illustrating the reduction of quantiser noise in an analog to digital converter circuit using preemphasis and deemphasis.
Figure 2:
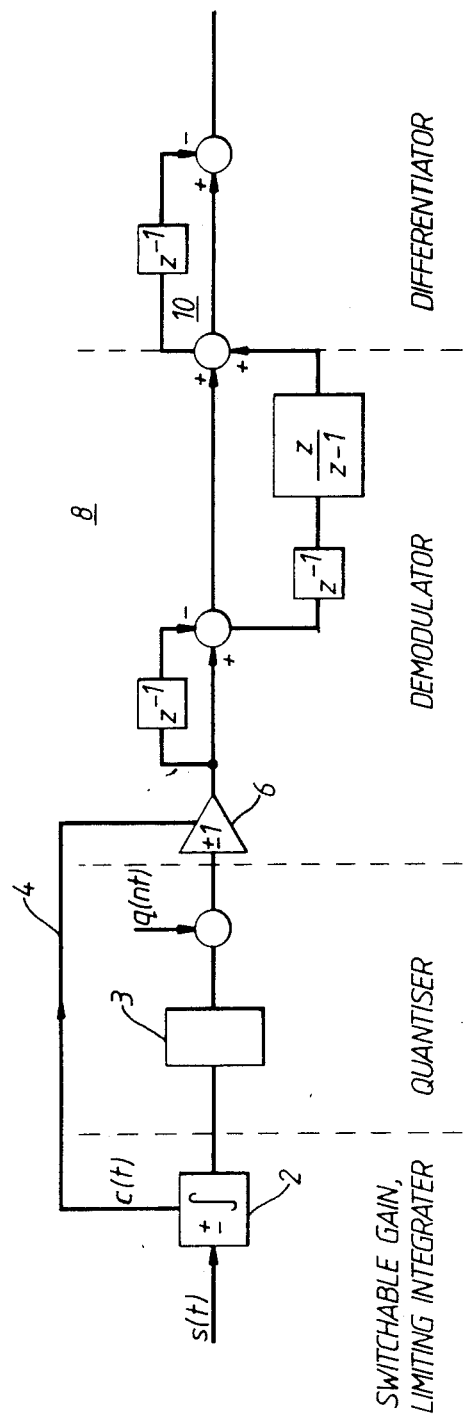
FIG. 2 is a circuit diagram of a known open-loop noise-shaping ADC.
Figure 3:
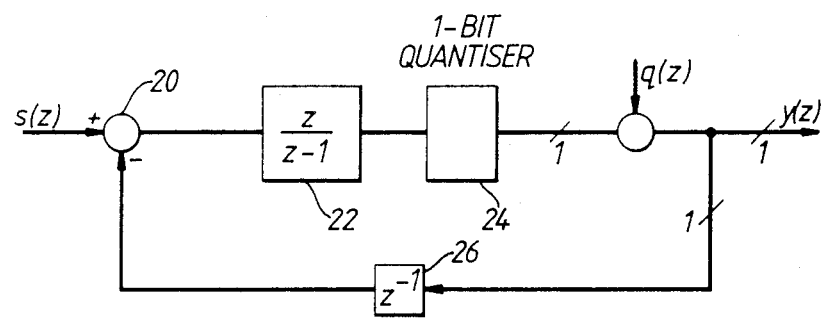
FIG. 3 is a circuit diagram of a known first order feedback loop, single-bit, noise shaping ADC.

One of the interesting features of the open-loop noise-shaping method described in FIG. 2 and Ref. 1, is that no voltage reference is needed to control over-range problems in the integrator. The disadvantages of the original system proposed by Claasen et al is that the gain control switching and the sampling clock are completely asynchronous. This problem is exacerbated by the proliferation of such asynchronous signals when the technique is extended to higher order coders.

Figure 11:
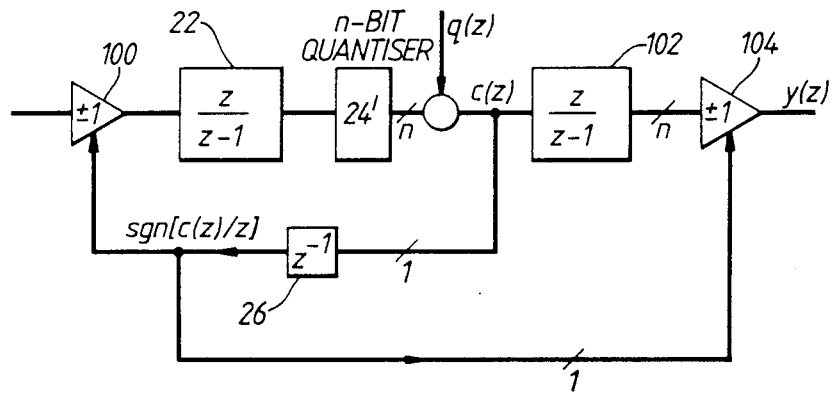
FIG. 11 is a circuit diagram of a first order, multi-bit quantiser noise-shaping ADC according to a sixth embodiment of the invention.

A sixth embodiment is shown in FIG. 11, wherein the feedback signal is the MSB of the quantiser output as in the above embodiments. In FIG. 11 which is a first order feedback loop, similr parts to these of FIG. 5 are indicated by the same reference numerals. The output of delay unit 26 in the feedback loop is applied to a control input of an amplifier 100 in order to determine the sign of amplification. The MSB of the output of the quantiser unit is applied to delay unit 26 and this is equivalent to the sign of the output. The output c of the circuit is given by $$c(z) = z^* s(z) \, \text{sgn}[c(z)/z]/(z-1) + q(z) \qquad (5)$$

The signal c is applied via an integrator 102 to an amplifier 104 whose sign of amplification is controlled by the output of delay unit 26. Thus the complete transfer function for the system shown in FIG. 11 is $$y(z) = s(z) + \text{sgn}[c(z)/z]^*(z-1)^* q(z)/z \qquad (6)$$

The presence of a sign factor in front of the quantisation noise is irrelevant to the noise power of the latter. Thus (6) represents the equation of a first-order noise-shaping ADC. Once again the quantiser used can be multi-bit, and so give a significant improvement over the more coventional one-bit system. Furthermore the implementation shown in FIG. 11 has several advantages over the original system described in Ref. 1.

Figure 12:
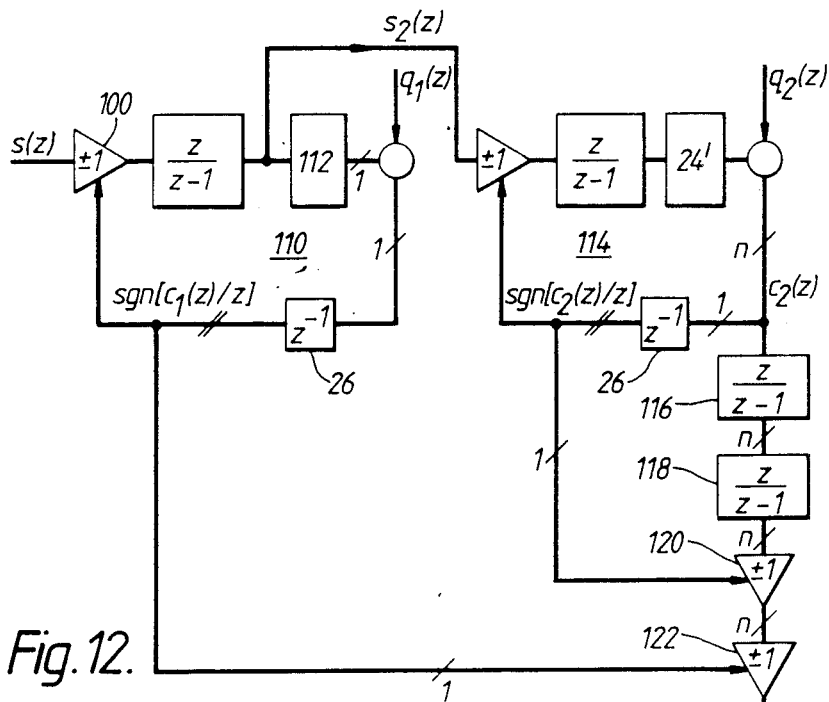
FIG. 12 is a circuit diagram of a cascade connected, second order, multi-bit quantiser noise-shaping ADC according to a seventh embodiment of the invention.
Figure 13:
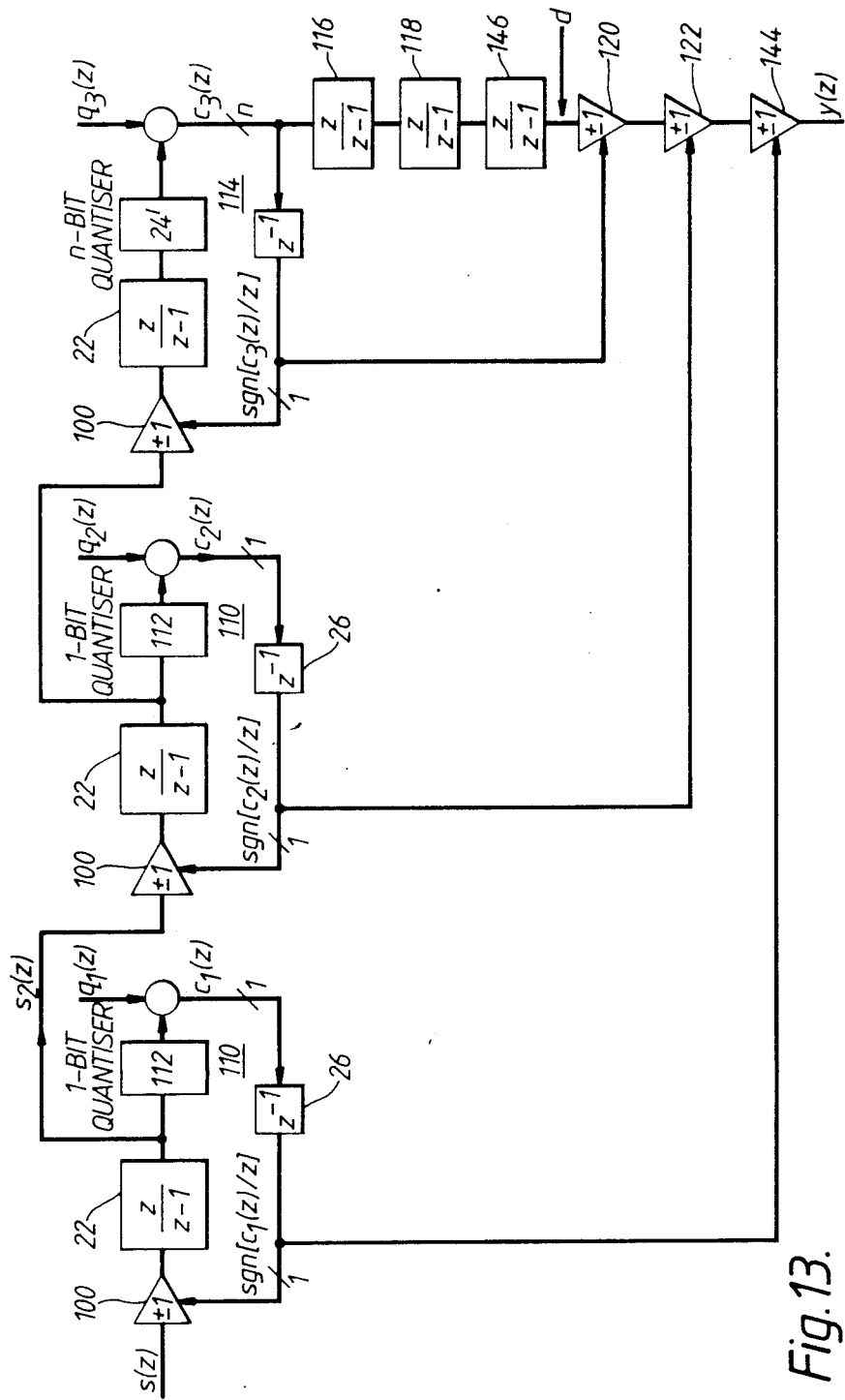
FIG. 13 is a circuit diagram of a third-order, cascade connected, multi-bit quantiser noise-shaping ADC according to an eighth embodiment of the present invention.

The concept of integrator gain switching can be extended to cascade coders of higher order as shown in FIGS. 12 and 13. It may be shown, that in these structures the quantisation noise of the earlier stages in the cascade does not appear in the expression for the output of the last stage. In consequence, only the final quantiser need be a multi-bit one. The preliminary quantiser elements need only be single bit, which makes the gain feedback structures rather less complex than the equivalent offset feedback ones referred to above.

Referring to FIG. 12, similar parts to these of FIG. 11 are indicated by the same reference numerals. The first quantiser circuit 110 has a single bit quantiser 112 therein. The input to quantiser 112 is fed as the input signal to the second quantiser circuit 114. The ouptut of the second quantiser circuit $c_2$ is fed via first and second differentiator circuits 116, 118 to an amplifier 120, the sign of amplification being controlled by the feedback signal from delay unit 26 of circuit 114. The output of amplifier 120 is applied as an input to an amplifier 122, the sign of amplification being controlled by the feedback signal from delay unit 26 of circuit 110.

Referring to FIG. 13, similar parts to those of FIG. 12 are indicated by similar reference numerals. FIG. 13 discloses an embodiment of the invention comprising a third-order cascade connected ADC. In FIG. 13, a further quantiser circuit 140 is provided identical to circuit 110 and having a single bit quantiser unit 112. The input to quantiser unit 112 is fed to the input of amplifier 100 circuit 110 and the feedback signal from delay unit 26 of circuit 140 is fed to control the sign of amplification of a amplifier 144 which receives the output of amplifier 122 to provide an output y. A further differentiator circuit 146 is connected in series with differentiators 116, 118 in order to provide appropriate signal shaping.

I claim:

1. An analog-to-digital converter circuit comprising a differencing means for comparing an analog input signal and a feedback signal to provide an output dependent on the difference between the signals, a feed-forward filter coupled to receive the differencing means output for providing low-frequency preemphasis, and coupled to the input of an n-bit quantiser (where n>1) for providing an output signal comprising an n-bit representation of the signal applied to its input, a means for truncating the quantiser output signal to the MSB and for providing a feed back signal whose value is dependent on the MSB, a feedback filter means coupled to receive the feedback signal and provide it to the differencing means, and correction means for providing a correction signal for combining with the quantiser output signal, to provide a converter circuit output signal which compensates for the effect of the truncation in the feedback loop.

2. A converter circuit according to claim 1 wherein a second differencing means and a second feed-forward filter are coupled between the first-mentioned feed-forward filter and the n-bit quantiser, and the feedback filter means is coupled to the first-mentioned and second differencing means.

3. A converter circuit according to claim 2 wherein a third differencing means and a third feed-forward filter are coupled between the second feed-forward filter and the n-bit quantiser, and the output of the feedback filter is coupled to the first-mentioned second and third differencing means.

4. A converter circuit according to claim 2 wherein the input to the n-bit quantiser is provided as an analog input signal to a second converter circuit similar to the converter circuit set forth above, and the converter circuit output signals are combined in a further combining means.

5. A converter circuit according to claim 4 wherein the input to the n-bit quantiser of the second converter circuit is provided as an input to a third converter circuit similar to the first-mentioned converter circuit set forth above, and the converter circuit output signals of all three converter circuits are combined in a further combining means.

6. A converter circuit according to claim 1 wherein the MSB of the quantiser output constitutes the feedback signal.

7. An analog-to-digital converter circuit comprising means for selectively inverting an input signal and feeding the signal via a feedforward filter providing low frequency pre-emphasis to an n-bit quantiser (where n>1) for providing an output signal comprising an n-bit representation of the signal applied to its input, a means for truncating the quantiser output signal to the MSB and providing a feedback signal whose value is dependent on the MSB, a feedback filter means coupled to receive the feedback signal and to provide it to the selective inversion means for control thereof, and correction means for correcting the quantiser output signal to provide a converter circuit output signal which compensates for the effect of the selective inversion of the input signal.

8. A circuit according to claim 7 including a second analog-to-digital converter circuit similar to the first-mentioned converter circuit wherein the output of the feedforward filter of the second circuit is applied as an input to the first converter circuit, and including second correction means for correcting the quantiser output signal of the first circuit to compensate for the selective inversion occuring within the second circuit.

9. A circuit according to claim 8 including a third analog-to-digital converter circuit similar to the first-mentioned converter circuit wherein the output of the feedforward filter of the third circuit is applied as an input to the second converter circuit, and including third correction means for correcting the quantiser output signal of the first circuit to compensate for the selective inversion occuring within the third circuit.

10. A circuit according to claim 8 wherein the second and/or third circuits include a single bit quantiser (n=1).

11. A circuit according to claim 7 wherein the feedback signal in the first, second and/or third circuits comprises the MSB.

12. A circuit according to claim 7 wherein the first, second and/or third correction means comprises a selective inversion means and controlled by the respective feedback signal.

* * * * *